(12) United States Patent
Arai et al.

(10) Patent No.: US 6,457,228 B1
(45) Date of Patent: Oct. 1, 2002

(54) METHOD FOR SEALING LIQUID COOLANT INTO MODULE

(75) Inventors: Natsuo Arai, Ebina; Kaoru Katayama; Eiichi Kiryuu, both of Hadano, all of (JP)

(73) Assignee: Hitachi, Ltd., Tokyo (JP)

( * ) Notice: Subject to any disclaimer, the term of this patent is extended or adjusted under 35 U.S.C. 154(b) by 28 days.

(21) Appl. No.: 09/592,649

(22) Filed: Jun. 13, 2000

(30) Foreign Application Priority Data

Jun. 14, 1999 (JP) .......................................... 11-167042

(51) Int. Cl.[7] ............................................... H01S 4/00
(52) U.S. Cl. ......................... 29/592.1; 29/832; 29/825; 174/52.3; 174/17.06
(58) Field of Search ............................... 29/592.1, 832, 29/825, 870, 898.11, 509; 174/15.1, 15.2, 52.4, 52.3, 17.06; 361/699, 700, 698; 165/80.4, 80.5; 257/704, 722, 713

(56) References Cited

U.S. PATENT DOCUMENTS

| | | | | |
|---|---|---|---|---|
| 3,993,123 A | * | 11/1976 | Chu et al. ...................... 165/80 |
| 4,341,432 A | * | 7/1982 | Cutchaw ................. 339/112 L |
| 4,897,762 A | * | 1/1990 | Daikoku et al. ............. 361/382 |
| 4,928,207 A | * | 5/1990 | Chrysler et al. | |
| 5,023,695 A | * | 6/1991 | Umezawa et al. ............. 357/82 |
| 5,373,417 A | * | 12/1994 | Barrett ........................ 361/699 |
| 5,390,077 A | * | 2/1995 | Paterson ..................... 361/700 |
| 5,413,965 A | * | 5/1995 | Webb et al. ................. 437/219 |
| 5,485,671 A | * | 1/1996 | Larson et al. .......... 29/840.032 |
| 5,508,884 A | * | 4/1996 | Brunet et al. ................ 361/698 |
| 5,522,452 A | * | 6/1996 | Mizuno et al. ................ 165/40 |
| 5,658,831 A | * | 8/1997 | Layton et al. ................ 29/832 |
| 5,986,884 A | * | 11/1999 | Jairazbhoy et al. ......... 361/700 |

FOREIGN PATENT DOCUMENTS

JP 9-213854 8/1997

* cited by examiner

*Primary Examiner*—Peter Vo
*Assistant Examiner*—Minh Trinh
(74) *Attorney, Agent, or Firm*—Mattingly, Stanger & Malur, P.C.

(57) ABSTRACT

A module is placed inside a chamber that can be sealed hermetically. The module includes a substrate incorporating a plurality of electronic circuit parts, a frame connected to the substrate so as to enclose the plurality of electronic circuit parts, and a cover placed facing the substrate and connected to the frame so as to cover an opening portion of the frame. The pressure in the chamber is reduced to a first pressure P1, and then the pressure is increased from the first pressure P1 to a second pressure P2. A liquid is filled into the module through a hole formed in the cover within the chamber, and the pressure inside the chamber is increased from the second pressure P2 to a third pressure P3. Then, the hole of the cover in the chamber is closed to seal the module hermetically, thereby sealing the liquid in the module. Thereafter, the pressure in the chamber is increased from the third pressure P3 to an atmospheric pressure P0, and the module is taken out of the chamber.

18 Claims, 4 Drawing Sheets

METHOD FOR SEALING LIQUID COOLANT INTO MODULE

BACKGROUND OF THE INVENTION

The present invention relates to a sealing method suited for sealing a liquid coolant into a module, a high-density module in particular, incorporated in a computer product such as a general-purpose computer, a server or the like.

A high-density module (hereinafter simply referred to as "module") incorporated in a computer product such as a general-purpose computer, a server or the like is configured as a housing using a multilayer ceramic substrate as its base portion incorporating a plurality of electronic circuit parts such as ICs, LSIs or the like as its base portion. A heat-transferring liquid coolant is sealed in this housing. This module is mounted in a computer with the liquid coolant sealed in. The heat generated from the electronic circuit parts mounted in the multilayer ceramic substrate is radiated to the outside through the sealed liquid coolant, a comb-like microfin placed on the upper surface of the electronic circuit parts, a cooling material inserted between this microfin and the cover of the module, and an air-cooling fin placed on the top surface of the module.

Such a high-density module has a problem of air bubbles trapped in the liquid coolant sealed in. The module has many gaps, a gap between the electronic circuit parts and the substrate, a gap between the microfin and the cooling material, etc. It is difficult to completely fill these gaps with the liquid coolant, and air bubbles remain trapped in these gaps. The existence of these air bubbles prevents the effective cooling of heat generated from the electronic circuit parts. Reduced local cooling efficiency may cause the throughput of the electronic circuit parts to deteriorate.

One example of prior art known for solving this problem is disclosed in JP-A-9-213854 specification. This document discloses a method for sealing a liquid coolant with the following steps.

That is:
1. under a condition where a module is uncovered, fill the liquid coolant into the module beforehand;
2. place this module in a chamber that can be hermetically sealed;
3. reduce the pressure in the chamber to an approximate vacuum;
4. then, introduce an inert gas into the chamber and adjust the pressure inside the chamber to a pressure between an atmospheric pressure and the approximate vacuum;
5. hermetically seal the module in that state; and
6. increase the pressure inside the chamber to atmospheric pressure and seal the liquid coolant into the module.

This method allows air bubbles trapped in the liquid coolant filling the module to be eliminated when the pressure inside the chamber is reduced to the approximate vacuum.

SUMMARY OF THE INVENTION

As computer products become compact and their processing speed improved, electronic circuit parts mounted on modules are made with higher density and higher integration. This results in an increase in the number of connection terminal between LSIs and the substrate. Thus, both the diameter and pitch of the connection terminals such as solder balls, etc. are further becoming more fine. Therefore, gaps between the electronic circuit parts and the multilayer ceramic substrate are also being narrowed, and it is desired to eliminate air bubbles trapped inside these narrowed gaps.

Thus, it is an object of the present invention to provide a method for sealing a liquid into a module, which can seal the liquid into a high-density module housing a substrate on which high-density, highly integrated electronic circuit parts are mounted, with substantially no air bubbles trapped inside.

In order to attain the above object, according to the invention, a module housing a plurality of electronic circuit parts is placed in a chamber that can be hermetically sealed. The pressure inside the chamber is set to a liquid filling pressure between a vacuum pressure and atmospheric pressure, and the module is filled with a liquid. Then, the pressure inside the chamber is set to a sealing pressure between the liquid filling pressure and atmospheric pressure. In this state, the module is tightly sealed and the liquid is sealed in the module.

Furthermore, the above described sealing pressure is set so that the pressure inside the module becomes lower than atmospheric pressure even while the electronic circuit parts operate and the temperature of the sealing liquid in the module increases.

DESCRIPTION OF THE PREFERRED EMBODIMENT

An embodiment of the invention will be explained below with reference to the attached drawings. The invention, however, is not limited to this embodiment.

Figure 1:
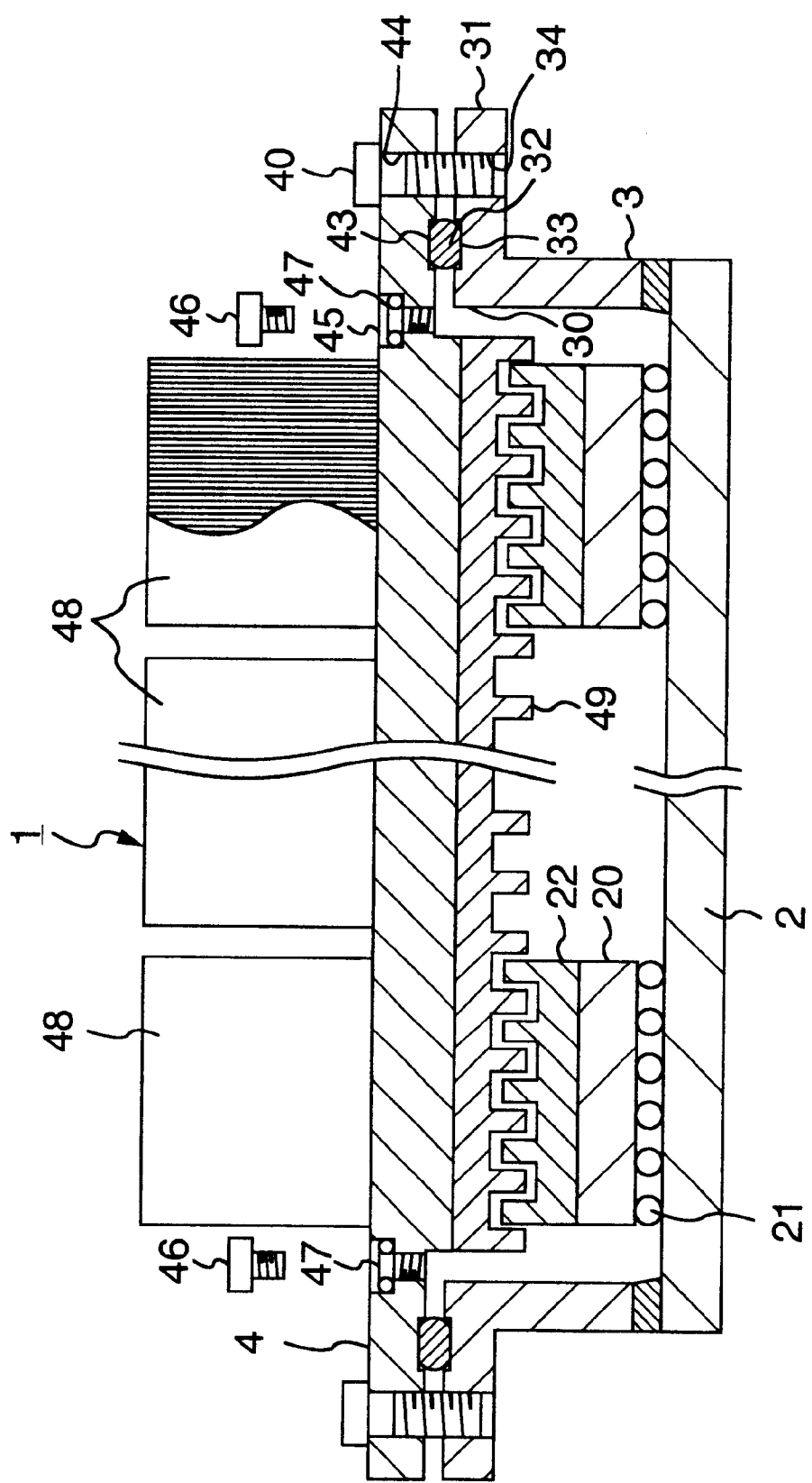
FIG. 1 is a schematic cross-sectional view of a module used in an embodiment of the invention and in a state before sealing.

FIG. 1 illustrates a module 1 used in this embodiment.

As shown in the figure, the module 1 includes a ceramic wiring board 2 forming a base portion of the module 1, a frame 3 soldered to the ceramic wiring board 2 in such a way as to surround LSIs (electronic circuit parts) 20, which are mounted on this ceramic wiring board 2, and a cover 4 that covers an opening portion 30 of this frame 3.

The LSI 20 is fixed to the ceramic wiring board 2 via a plurality of solder balls 21 having a diameter on the order of tens of microns. Moreover, a cooling fin 22 is arranged on the upper surface of the LSI 20. Springs (not shown) are provided between the cooling fin 22 and a cooling material 49, and the cooling fin 22 is kept in close contact with the LSI 20 by the forces of the springs.

At the top end portion of the frame 3, a flange section 31 extending horizontally is provided. This flange section 31 is formed with a groove 33, in which a heat-resistant sealing material 32 is disposed to assure airtightness with the cover 4, and screw holes 34 for fastening screws 40 to secure the cover 4 to the frame.

A groove 43 is formed in the periphery of the cover 4, which corresponds to the groove 33 in the flange section 31 of the frame 3. Screw holes 44 are also provided in the periphery of the cover 4, which correspond to the screw holes 34. Furthermore, two sealing holes 45 are formed in the periphery further inside than the groove 43, which serve as inlets to charge a liquid coolant. These sealing holes 45 are 10 each provided with screw grooves and flanges. After the module is filled with the liquid coolant, the module 1 can be tightly sealed by pressing O-rings 47 attached to the flange with the sealing screws 46. Furthermore, an air-cooling heat sink 48 is bonded to the top surface of the cover 4. A cooling material 49 having fins complementary to the shape of the cooling fin 22 is bonded to the lower surface of the cover 4.

A chamber used to fill the module 1 with the liquid coolant will be explained below.

Figure 2:
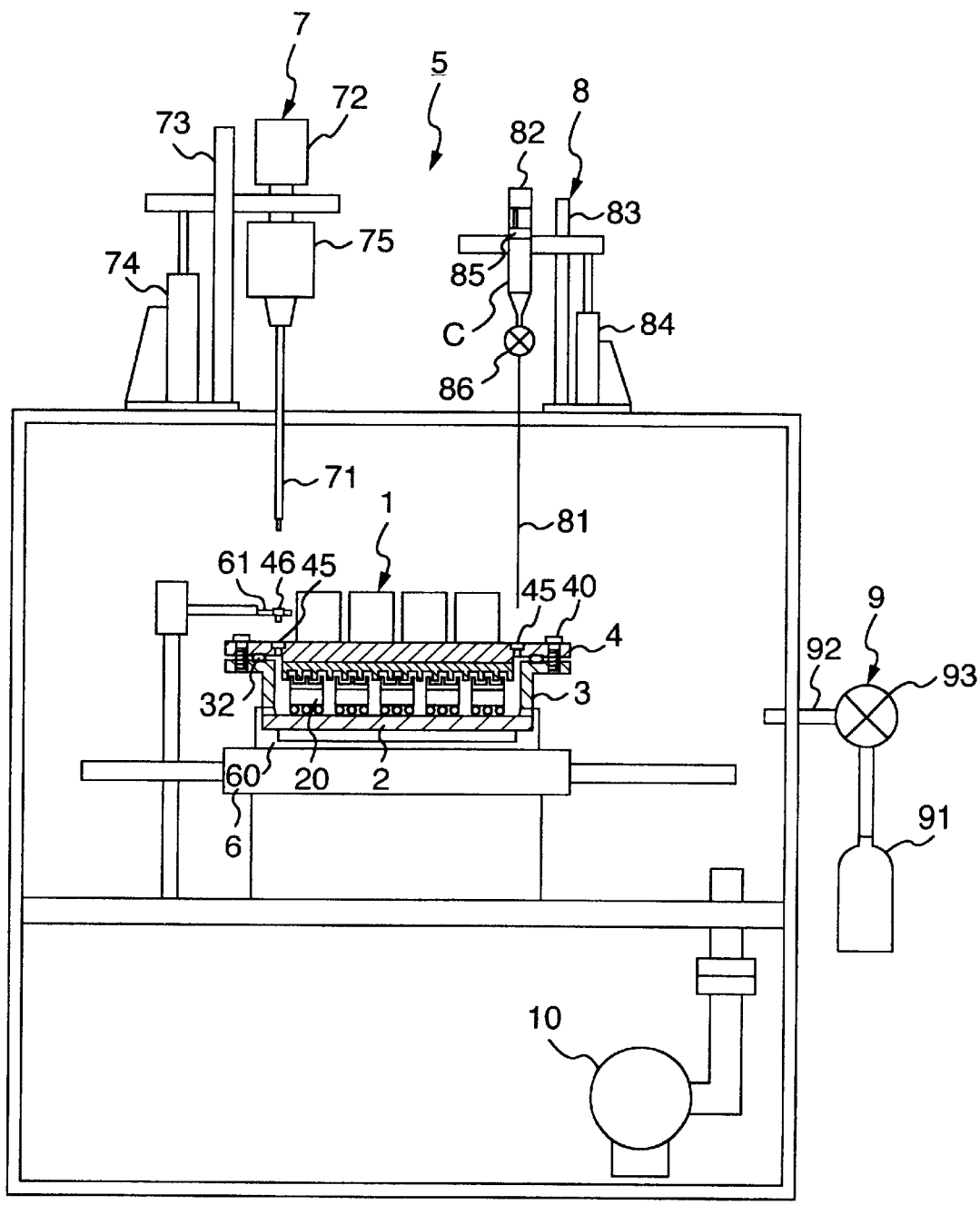
FIG. 2 is a schematic view showing a state of the module placed in a chamber according to the embodiment of the invention.

FIG. 2 illustrates a state of the module 1 placed in the chamber 5 that can be hermetically sealed.

As shown in the figure, the chamber 5 includes an xy table 6 that positions and fixes the module 1, a fastening unit 7 that closes the sealing holes 45 of the cover 4 of the module 1 by means of the sealing screws 46, a filling unit 8 that fills the module 1 with the liquid coolant through the sealing holes 45 of the cover 4, a gas supply unit 9 that supplies an inert gas and an oil-sealed rotary vacuum pump 10 that deaerates the inside of the chamber 5.

The xy table 6 is a well-known movable table provided movably in the two orthogonal directions on a horizontal plane (x, y directions). The xy table 6 has feed screws provided in the x, y directions, a motor that rotates these feed screws, an encoder and a table that moves according to these feed screws and guides (both not shown). A set jig 60 is provided on the xy table 6 to position and fix the module 1. A chuck 61 is provided in the chamber 5 to grip the sealing screw 46 described above.

The fastening unit 7 includes a motor-driven driver 72 that has a driver bit 71 corresponding to the sealing screw 46, and a lifting device 74 that moves this driver 72 up and down along a guide 73. The driver 72 is provided with a torque controller 75 that adjusts a torque for fastening.

The coolant filling unit 8 includes a syringe 82 having a supply nozzle 81, which can be inserted into the sealing hole 45, and a lifting device 84 that moves this syringe 82 up and down along a guide 83. The syringe 82 is provided with a piston 85 and a valve 86 so as to adjust the volume of the liquid coolant supplied from the supply nozzle 81. Opening this valve 86 allows the liquid coolant to be supplied from the supply nozzle 81 by the self weight of the piston 85 and a pressure difference between atmospheric pressure and the inner pressure of the decompressed chamber 5, as will be described later.

The gas supply unit 9 includes a gas bomb 91 filled with compressed nitrogen gas for pressure adjustment and a pipe 92 that leads the nitrogen gas in this gas bomb 91 into the chamber 5. The pipe 92 is provided with a flow rate control valve 93 that controls the flow rate of the nitrogen gas supplied.

Figure 3:
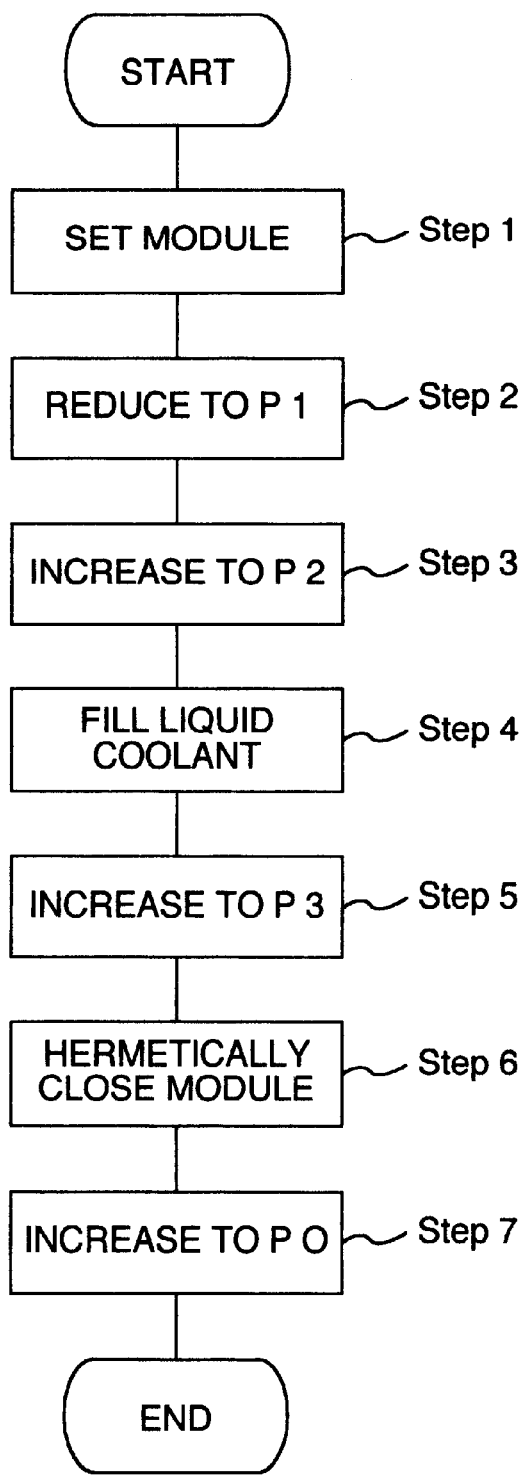
FIG. 3 is a flow chart showing the procedure according to the embodiment of the invention.

Next, the procedure for sealing the liquid coolant into the above described module 1 will be explained with reference to the flow chart in FIG. 3, and FIGS. 2 and 4. Sealing the liquid coolant into the module 1 is carried out at ordinary temperatures.

In Step 1, as shown in FIG. 2, the module 1 before sealing (before filling it with the liquid coolant) is positioned and fixed by the set jig 60 on the xy table 6 disposed in the chamber 5. At this time, the frame 3 and cover 5 are fastened together with the fastening screws 40. As shown in FIG. 4, the pressure inside the chamber 5 and the module 1 at this time is atmospheric pressure P0.

Moreover, the syringe 82 of the coolant filling unit 8 has beforehand been filled with the liquid coolant C. As the liquid coolant C, it is preferable to use thermal conductive, insulating and heat resistant oil. In this embodiment, poly α olefin is used. It is also preferable to use the liquid coolant C well deaerated using a deaerator (not shown) such as a deaerating chamber and stirrer beforehand.

The amount of the liquid coolant C to be filled, since the module 1 is normally used in an upright position, is set to take a level at which a LSI at the top of this module in the upright position and the cooling fin attached thereto are almost immersed in the liquid coolant. Accordingly, the nitrogen gas is also contained in the sealed module 1. This nitrogen gas serves to prevent the oxidation of the liquid coolant C, absorb the volume expansion of the liquid coolant C when the volume of the liquid coolant C expands and prevent the deformation of the frame 3 or defective coupling between the frame 3 and the ceramic wiring board 2. The volume ratio of the liquid coolant C to the nitrogen gas after filling and sealing of the liquid coolant C in the inner space of the module 1 is set, for example, to 8:2.

Figure 4:
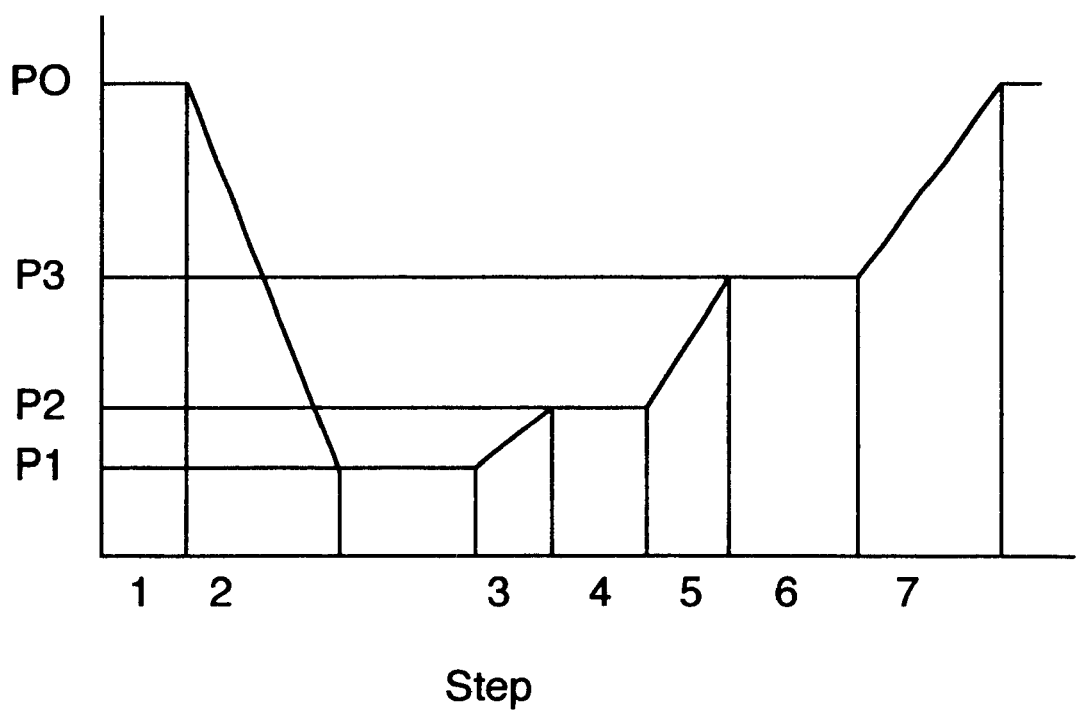
FIG. 4 is a view showing a pressure in the chamber at each step according to the embodiment of the invention.

Then, in Step 2, the vacuum pump 10 of the chamber 5 is operated and the pressure P1 inside the chamber 5 is reduced from atmospheric pressure P0 to an approximate vacuum pressure P1 (see FIG. 4). The pressure P1 inside the chamber 5, though it depends on the capacity of the vacuum pump, is from 0.1 to 0.2 Torr in this embodiment, and the chamber 5 and module 1 are deaerated to an approximate vacuum condition.

Then, in Step 3, the vacuum pump 10 is stopped, the flow rate control valve 93 is opened and the nitrogen gas is introduced from the gas bomb 91 into the chamber 5 so that the pressure inside the chamber 5 becomes a predetermined coolant filling pressure P2. Due to a pressure increase accompanying the introduction of the nitrogen gas, the pressure inside the chamber 5 and module 1 is increased to the coolant filling pressure P2. The coolant filling pressure P2 is from 50 to 150 Torr in this embodiment.

In Step 4, under this coolant filling pressure P2, the supply nozzle 81 is lowered using the lifting device 84 and the end of the supply nozzle 81 is inserted into the sealing hole 45 of the module 1. Then, the valve 86 is opened and the liquid coolant C stored in the syringe 82 is filled into the module 1 through the sealing hole 45. During this filling, since the pressure inside the module is lower than atmospheric pressure, the liquid coolant C is filled into the module by this pressure difference and the self weight of the piston. Moreover, since the pressure inside the module 1 is higher than the vacuum pressure, this prevents the entry of air bubbles from the joints of the syringe 82 and nozzle 81 or the reverse spouting of the liquid coolant through the sealing hole 45 of the module 1, enabling smooth filling while suppressing the mixture of air bubbles during filling to a minimum.

Then, in Step 5, after the filling of the liquid coolant C is completed, the flow rate control valve 93 is opened again and the nitrogen gas is introduced from the gas bomb 91 into the chamber 5 again so that the pressure inside the chamber 5 becomes a sealing pressure P3 between the liquid coolant filling pressure P2 and atmospheric pressure P0. Due to a pressure increase accompanying the introduction of the nitrogen gas, the pressure inside the chamber 5 and module 1 is increased to the sealing pressure P3. This sealing pressure P3 is set to such a value that the pressure inside the module 1 is lower than the atmospheric pressure P0 even when the LSI 20 operates and its temperature increases to the allowable upper limit temperature, for example, 70° C. and the temperature of the liquid coolant C increases. In this embodiment, it is set from 400 to 500 Torr.

Then, in Step 6, the module 1 is moved using the xy table 6 and positioned so that the sealing hole 45 comes right under the fastening unit 7. Subsequently, the driver bit 71 is lowered using the lifting device 74. By running the motor 72, the sealing screw 46 held by the chuck 61 is fastened into the sealing hole 45 using the driver bit 71. At this time, the torque is adjusted by the torque controller 75 so that the sealing screw is fastened with a torque enough to deform the O-ring 47.

This fastening operation is repeated the number of times corresponding in number with the sealing holes 45 provided (two in this embodiment) by moving the module 1 using the xy table 6. In this way, the module 1 is sealed hermetically and the sealing of the liquid coolant C into the module 1 is completed.

Then, in Step 7, the flow rate control valve 93 is closed to stop the supply of the nitrogen gas from the gas bomb 91. A leak valve (not shown) of the vacuum pump 10 is opened to introduce external air into the chamber 5. After ensuring that the pressure inside the chamber 5 has returned to the atmospheric pressure P0, the module 1 is taken out of the chamber 5, and this completes the procedure.

According to this embodiment, when filling the liquid coolant C into the module 1, the pressure inside the chamber 5 is set to the filling pressure P2, which is a negative pressure, and therefore it is possible to minimize the generation of air bubbles during filling as compared with the conventional way of filling the liquid coolant C under atmospheric pressure. Thus, this embodiment can improve the cooling performance of the module 1 and thereby the throughput of a computer incorporating this module, as comparison with the conventional way.

Moreover, the pressure inside the module 1 is set to be lower than the atmospheric pressure even when the LSI 20 operates and the temperature of the liquid coolant C sealed in the module 1 increases. Accordingly, even if the volume of the liquid coolant C increases as the temperature increases, this will not cause the frame 3 to be deformed or result in defective coupling between the ceramic wiring board 2 and the frame 3, making it possible to suppress the leakage of the liquid coolant C while the module 1 is operating.

In the above embodiment, explained as a module in which a liquid coolant is to be sealed is the air-cooled module having the air-cooling heat sink 48 on the cover 4. However, the method of sealing a liquid coolant into a module according to the invention is also applicable to a water-cooled module having a cooling water path provided in a module cover if it has a sealing hole that serves as the inlet.

As the pressure adjustment gas, it is preferable to use nitrogen gas, which is an inert gas, as is in the embodiment. However, other inert gases such as helium, argon, neon or other gases, if they at least do not deteriorate the effects of the invention, may also be used.

In the above described embodiment, two sealing holes are formed as the inlets, but the number of sealing holes may also be one or two or more.

Furthermore, the above described embodiment describes the case where sealing operation is carried out at ordinary temperatures, but it is possible to change the temperature for operation as far as it does not deteriorate the effects of the invention.

What is claimed is:

1. A method for sealing a liquid into a module which includes a substrate incorporating a plurality of electronic circuit parts, a frame connected to the substrate in such a way as to enclose the plurality of electronic circuit parts, and a cover arranged facing the substrate and connected to the frame in such a way as to cover an opening portion of the frame, comprising the steps of:

placing the module inside a chamber that can be sealed hermetically;

reducing pressure inside the chamber to a first pressure P1;

increasing the pressure inside the chamber from the first pressure P1 to a second pressure P2;

filling the liquid into the module through a hole formed in the cover within the chamber;

increasing the pressure inside the chamber from the second pressure P2 to a third pressure P3; and closing the hole of the cover in the chamber to seal the module hermetically and thereby seal the liquid into the module hermetically.

2. The method for sealing a liquid into a module according to claim 1, wherein after the liquid is sealed into the module hermetically, the pressure inside the chamber is increased from the third pressure P3 to atmospheric pressure P0 and the module is taken out of the chamber.

3. The method for sealing a liquid into a module according to claim 1, wherein in said step of placing the module in the chamber, the pressure inside the chamber is the atmospheric pressure P0 and the module is placed inside the chamber with the hole in the cover being open.

4. The method for sealing a liquid into a module according to claim 3, wherein in said step of reducing the pressure inside the chamber, the pressure is reduced from the atmospheric pressure P0 to an approximate vacuum pressure a s the pressure P1.

5. The method. for sealing a liquid into a module according to claim 1, wherein in said step of increasing to the second pressure P2 and said step of increasing to the third pressure P3, the respective pressures are increased by introducing a gas into the chamber.

6. The method for sealing a liquid into a module according to claim 5, wherein in said step of increasing to the second pressure P2 and said step of increasing to the third pressure P3, an inert gas is introduced as said gas.

7. The method for sealing a liquid into a module according to claim 1, wherein the first pressure P1 is an approximate vacuum pressure, the second pressure P2 is a pressure between the first pressure P1 and atmospheric pressure P0, and the third pressure P3 is a pressure between the second pressure P2 and the atmospheric pressure P0.

8. The method for sealing a liquid into a module according to claim 1, wherein in said step of increasing to the third pressure P3, the pressure inside the module is increased until the pressure inside the module falls below the atmospheric pressure P0 even when the electronic circuit parts operate and the temperature of the liquid sealed in the module increases.

9. The method for sealing a liquid into a module according to claim 8, wherein the pressure inside the module is increased to from 400 Torr to 500 Torr as the third pressure P3.

10. A method for sealing a liquid into a module which includes a housing portion accommodating a plurality of electronic. circuit parts and a cover arranged facing the housing portion and covering an opening of the housing portion, comprising the steps of:

placing the module inside a chamber that can be sealed hermetically;

reducing pressure inside the chamber to a first pressure P1;

increasing the pressure inside the chamber from the first pressure P1 to a second pressure P2;

filling the liquid into the module through a hole formed in the cover within the chamber;

increasing the pressure inside the chamber from the second pressure P2 to a third pressure P3; and closing the hole of the cover in the chamber to seal the module hermetically and thereby seal the liquid into the module hermetically.

11. The method for sealing a liquid into a module according to claim 10, wherein after the liquid is sealed into the module hermetically, the pressure inside the chamber is increased from the third pressure P3 to atmospheric pressure P0 and the module is taken out of the chamber.

12. The method for sealing a liquid into a module according to claim 10, wherein in said step of placing the module in the chamber, the pressure inside the chamber is the atmospheric pressure P0 and the module is placed inside the chamber with the hole in the cover being open.

13. The method for sealing a liquid into a module according to claim 12, wherein in said step of reducing the pressure inside the chamber, the pressure is reduced from the atmospheric pressure P0 to an approximate vacuum pressure as the pressure P1.

14. The method for sealing a liquid into a module according to claim 10, wherein in said step of increasing to the second pressure P2 and said step of increasing to the third pressure P3, the respective pressures are increased by introducing a gas into the chamber.

15. The method for sealing a liquid into a module according to claim 14, wherein in said step of increasing to the second pressure P2 and said step of increasing to the third pressure P3, an inert gas is introduced as said gas.

16. The method for sealing a liquid into a module according to claim 10, wherein the first pressure P1 is an approximate vacuum pressure, the second pressure P2 is a pressure between the first pressure P1 and atmospheric pressure P0, and the third pressure P3 is a pressure between the second pressure P2 and the atmospheric pressure P0.

17. The method for sealing a liquid into a module according to claim 10, wherein in said step of increasing to the third pressure P3, the pressure inside the module is increased until the pressure inside the module falls below the atmospheric pressure P0 even when the electronic circuit parts operate and the temperature of the liquid sealed in the module increases.

18. The method for sealing a liquid into a module according to claim 17, wherein the pressure inside the module is increased to from 400 Torr to 500 Torr as the third pressure P3.

* * * * *